United States Patent [19]

Nozawa

[11] Patent Number: 4,529,916
[45] Date of Patent: Jul. 16, 1985

[54] ALTERNATE SWEEPING SYSTEM FOR USE IN OSCILLOSCOPE

[75] Inventor: Atsushi Nozawa, Koganei, Japan

[73] Assignee: Hitachi Denshi Kabushiki Kaisha, Tokyo, Japan

[21] Appl. No.: 347,471

[22] Filed: Feb. 10, 1982

[30] Foreign Application Priority Data

Feb. 18, 1981 [JP] Japan .................... 56-22829

[51] Int. Cl.³ .................... G01R 13/26; G01R 13/28
[52] U.S. Cl. .................... 315/385; 315/392
[58] Field of Search ............... 315/385, 364, 381, 393, 315/391, 392, 384; 340/731, 743

[56] References Cited

U.S. PATENT DOCUMENTS

| 3,404,394 | 10/1968 | Bassett | 340/743 |
| 3,909,671 | 9/1975 | Nakaya | 315/395 |
| 4,109,182 | 8/1978 | Dalton | 315/392 |
| 4,241,340 | 12/1980 | Raney, Jr. | 340/731 |

OTHER PUBLICATIONS

"Understanding Oscilloscopes and Display Waveforms" published by Kendall Webster Sessions, Walter A. Fisher.

Primary Examiner—Theodore M. Blum
Assistant Examiner—Gilberto Barrón, Jr.
Attorney, Agent, or Firm—Charles E. Pfund

[57] ABSTRACT

In an alternating sweeping system for use in an oscilloscope of the type wherein a sweeping signal and a delayed sweeping signal are alternately supplied to a horizontal deflection circuit of the oscilloscope, and wherein a unblanking signal and a delayed unblanking signal are alternately supplied to a brightness modulation circuit, widths of the delayed sweeping signal and the delayed unblanking signal made to be less than one half of width of the sweeping signal and the unblanking signal so that the delayed blanking signal and the delayed unblanking signal are used a plurality of times during an interval in which the sweeping signal and the unblanking signal are used once.

2 Claims, 3 Drawing Figures

ALTERNATE SWEEPING SYSTEM FOR USE IN OSCILLOSCOPE

BACKGROUND OF THE INVENTION

This invention relates to an improvement of an alternate sweeping system for use in an oscilloscope.

An alternate sweeping system has been used for a high grade oscilloscope for the purpose of displaying a waveform along an enlarged or expanded time axis. According to the alternate sweeping system a sweeping signal having a large signal width and a delayed sweeping signal having a small signal width are alternately applied to the horizontal deflection circuit of a cathode ray tube so as to alternately display a waveform with a not enlarged time axis and a waveform with an enlarged time axis.

FIG. 1 diagrammatically shows such manner of display of a pulse signal, for example, in which A shows a waveform caused by a not delayed sweeping signal and B a waveform caused by a delayed sweeping signal. A thick line portion of A is enlarged as shown in B.

However, the waveform caused by the delayed sweeping signal has a time axis enlarged more than several ten times of that of the waveform caused by the not delayed sweeping signal so that when sweeping with the delayed sweeping signal, the time required for an electron beam to impinge upon the fluorescent screen of the cathode ray tube is shortened with the result that the quantity of light emitted at bright lines decreases, thus making it difficult to observe the waveform caused by the delayed sweeping signal.

This phenomenon results in the following disadvantage. More particularly, where an image signal waveform is to be observed, a waveform of one frame is displyed by a not delayed sweeping signal, while a waveform for an interval of 1H (an interval between the beginning of one horizontal scanning line and the beginning of the next horizontal scanning line) is displayed with a delayed scanning signal. In this case, as the ratio of enlargement of the time axes becomes large, the quantity of light emitted by bright lines of the waveform displayed for 1H decreases greatly, thereby not only making difficult to observe visually the displayed waveform but also making it impossible to photograph the displayed waveform.

SUMMARY OF THE INVENTION

Accordingly, it is an object of this invention to provide an improved alternate sweeping system for use in an oscilloscope capable of increasing the brightness of a waveform displayed by a delayed sweeping signal.

According to this invention, there is provided an alternate scanning system for use in an oscilloscope of the type wherein a sweeping signal and a delayed sweeping signal synchronous therewith and having a narrower signal width than the sweeping signal are alternately applied to the oscilloscope, and wherein an unblanking signal corresponding to the sweeping signal and a delayed unblanking signal corresponding to the delayed sweeping signal are alternately applied to said oscilloscope, characterized by means for using the unblanking signal and the delayed unblanking signal a plurality of times during an interval in which the sweeping signal and the unblanking signal are used once.

BRIEF DESCRIPTION OF THE DRAWINGS

In the accompanying drawings.

DESCRIPTION OF THE PREFERRED EMBODIMENT

Figure 1:
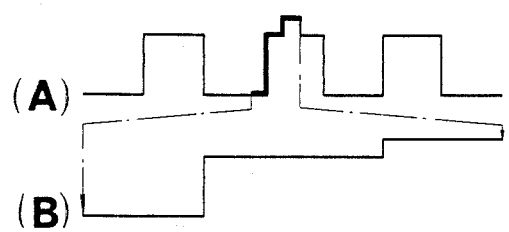
FIG. 1 shows waveforms displayed with a not delayed sweeping signal and with a delayed sweeping signal respectively.
Figure 3:
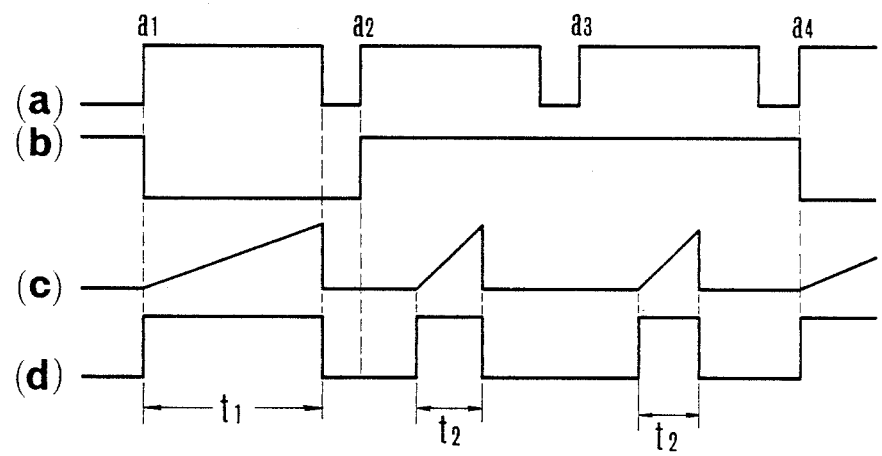
FIG. 3 is a time chart showing waveforms at various points of the circuit shown in FIG. 2.
Figure 2:
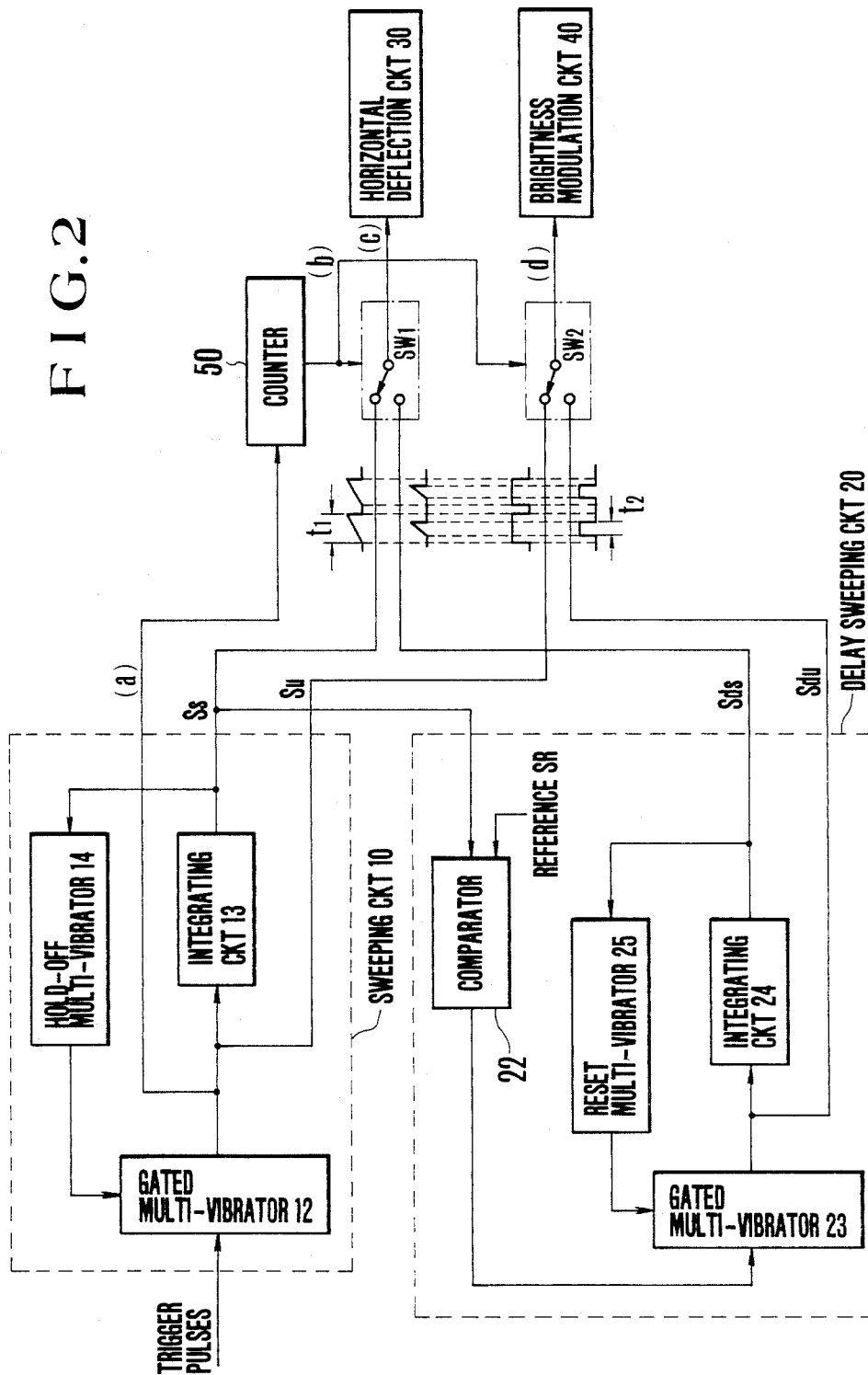
FIG. 2 is a block diagram showing one embodiment of this invention.

In one embodiment of this invention shown in FIG. 2, a sweeping circuit 10 generates a sweeping signal Ss and an unblanking signal Su synchronous with the sweeping signal and having the same width t1 as the sweeping signal Su. The sweeping circuit 10 comprises a gated multivibrator 12 such as a flip-flop circuit with an output of rectangular pulse wave form, an integrating circuit 13 integrating the output of the gated multivibrator 12 to generate the sweeping signal Ss, and a hold-off multivibrator 14 resetting the gated multivibrator 12 when the output of the integrating circuit 13 exceeds a predetermined level. When a trigger pulse is applied to the gated multivibrator 12 as an input thereof, a gate signal of the rectangular pulse wave form as shown in FIG. 3a is outputted from the gated multivibrator 12. The gate signal also serves as a unblanking signal. The gate signal is sent to the integrating circuit 13 for converting it to a saw tooth signal Ss as shown in FIG. 3c. The saw tooth signal is inputted into the hold-off multivibrator 14 so that, when the saw tooth signal reaches the predetermined threshold level, the multivibrator 14 may reset the gated multivibrator 12 to complete a sweeping cycle. A delay sweeping circuit 20 generates a delayed sweeping signal Sds synchronous with the sweeping signal Ss but having shorter width t2 than Ss, and a delayed unblanking signal Sdu synchronous with the delayed sweeping signal Sds and having Sds width as the same.

The delay sweeping circuit 20 comprises a comparator 22 which compares the output of the integrating circuit 13, that is the instantaneous value of the sweeping signal Ss, with a reference signal $S_R$, the comparator 22 producing a set signal when the sweeping signal Ss exceeds the reference signal $S_R$, a gated multivibrator 23 for producing a delayed gate signal as a delayed unblanking signal Sdu in response to an output of the comparator 22, an integrating circuit 24 for receiving the delayed gate signal to produce a delayed sweeping signal Sds, and a reset multivibrator 25 for resetting the gated multivibrator 23 when the output of the integrating circuit 24 exceeds a predetermined level.

It is to be noted that signals Ss and Sds have a saw tooth waveform, but signals Su and Sdu have a rectangular waveform. It is also to be noted that the ramp duration of the delayed sweeping signal is shorter than that of the sweeping signal for the purpose of being used for enlarged sweeping operation.

These sweeping signals Ss and Sds are supplied to stationary contacts of a transfer switch SW1, an analogue switch for example. The transfer switch SW1 applies either one of the signals Ss and Sds to a horizontal deflection circuit 30 of a cathode ray tube, not shown. The unblanking signals Su and Sdu are also applied to a transfer switch SW2 similar to transfer switch SW1 and operated synchronously therewith.

The transfer switch SW2 sends either one of the unblanking signals to the brightness modulation circuit 40 of the cathode ray tube.

A counter 50 is provided to count the number of the leading edges of the unblanking signals Su (shown by FIG. 3a) for producing a control pulse (shown by FIG. 3b), which is used to control the transfer switches SW1 and SW2. While the control pulse is at a high level the movable contacts of the transfer switches SW1 and SW2 are thrown to the side of the delay sweeping circuit 20, whereat while the control pulse is at a low level, the transfer switches SW1 and SW2 are thrown to the side of the sweeping circuit 10. Now suppose that the counter 50 is constituted by a three stage counter such as J-K type flip-flops with two stage, for example. In FIG. 3a with a first building up portion of the unblanking signal Su, the level of the control pulse from the counter 50 becomes low and the transfer switches SW1 and SW2 are thrown to the side of the sweeping circuit 10 as shown in FIG. 2. Next at a second building up portion a2 of the unblanking signal Su, the control pulse becomes high and the transfer switches SW1 and SW2 are switched to the side of the delay sweeping circuit 20. Further, the control pulse having been kept in high level at a third building up portion a3 of the unblanking signal Su, the transfer switches SW1 and SW2 do not perform the switching operation. Again at a building up portion a4 of the unblanking portion Su the counter 50 produces a low level output signal as the control pulse and then the above operation is repeated. In this example, while the sweeping signal Ss and the unblanking signal Su are selected once, the delayed sweeping signal Sds and the delayed unblanking signal Sdu are selected twice or more, so that sweeping signal (FIG. 3c) and unblanking signal (FIG. 3d) are sent out alternately from the transfer switches SW1 and SW2 in the sequence shown.

Accordingly, during the width t1 of the sweeping signal (FIG. 3c) a preparatory sweeping is made with not enlarged time axis, but during the width t2 of the signal shown in FIG. 3c, delayed sweepings with their time axes enlarged are repeatedly and continuously performed. At the same time a brightness modulation is effected by the blanking signal shown in FIG. 3d corresponding thereto so that the fluorescent screen of the cathode ray tube is luminescence each time a sweeping is made. When the delayed sweeping is made twice consequently, the quantity of light during this period t2×2 becomes substantially equal to that emitted during period t1 thus enabling easy observation and photographing of the waveform during the delayed sweeping.

In this example a three stage counter is used. However, it is advantageous to use a programmable counter so as to control the number of counts according to the ratio of time axis enlargements of the preparatory sweeping and the delayed sweeping. The ratio of the number of uses of the sweeping signal Ss and the unblanking signal Sds to that of the delayed sweeping signal Sds and the delayed unblanking signal Sdu can be selected as desired. A signal obtained by inverting a signal shown in FIG. 3c may be used as the control signal for reversing the order of operations of the transfer switches SW1 and SW2.

As above described according to the sweeping system of this invention the brightness of the displayed waveform can be increased at the time of the delayed sweeping thus making easy observation and photographing.

What is claimed is:

1. In an alternate sweeping system for use in an oscilloscope of the type wherein a sweeping signal and a delayed sweeping signal synchronous therewith and having a narrower signal width than said sweeping signal for expanding one predetermined portion of a waveform to be displayed are alternately applied to said oscilloscope, and wherein an unblanking signal corresponding to said sweeping signal and a delayed unblanking signal corresponding to said delayed sweeping signal are alternately applied to said oscilloscope, the improvement which comprises means for using said delayed sweeping signal and said delayed unblanking signals to produce the same screen trade a plurality of times following each interval in which said sweeping signal and said unblanking signal are used once thereby increasing the intensity of the expanded portion of the waveform produced by the delayed sweeping signal by the multiple of said plurality relative to the sweeping signal trace.

2. An alternate sweeping system for use in an oscilloscope including a horizontal deflection circuit and a brightness modulation circuit comprising:
   a sweeping circuit for generating a sweeping signal and a unblanking signal synchronous with and having the same width as said sweeping signal;
   a delay sweeping circuit for generating a delayed sweeping signal and a delayed unblanking signal which are synchronous with each other and delayed a predetermined time from said sweeping signal and said unblanking signal, said delayed sweeping signal and said delayed unblanking signal having a narrower width than said sweeping signal and said unblanking signal for producing an expanded portion of the waveform;
   a first transfer switch for selectively applying either one of said sweeping signal and said delayed sweeping signal to said horizontal deflection circuit;
   a second transfer switch for selectively applying either one of said unblanking signal and said delayed unblanking signal to said brightness modulation circuit;
   a counter of at least three stages counting the number of leading edges or trailing edges of said blanking signal for producing a control signal upon counting at least three of said edges and means for applying said control signal to said first and second transfer switches for alternating operations thereof to produce a plurality of the same delayed sweeping signals following each said sweeping siqnal thereby increasing the intensity of the expanded portion of the waveform produced by the delayed sweeping signal trace by the multiple of said plurality.

* * * * *

UNITED STATES PATENT AND TRADEMARK OFFICE
CERTIFICATE OF CORRECTION

PATENT NO. : 4,529,916

DATED : July 16, 1985

INVENTOR(S) : Nozawa

It is certified that error appears in the above-identified patent and that said Letters Patent is hereby corrected as shown below:

Col. 2, lines 40 & 41 should read: --the delayed sweeping signal Sds and having the same width as Sds--

Col. 3, l. 11: change "whereat" to --whereas--

Col. 4, l. 58: change "siqnal" to --signal--

Signed and Sealed this

Twenty-fifth Day of March 1986

[SEAL]

Attest:

DONALD J. QUIGG

Attesting Officer

Commissioner of Patents and Trademarks